United States Patent [19]

Black, Jr.

[11] 4,376,277
[45] Mar. 8, 1983

[54] DYNAMIC CONTACT CHECKING CIRCUIT

[75] Inventor: Robert A. Black, Jr., Hennepin, Minn.

[73] Assignee: Honeywell Inc., Minneapolis, Minn.

[21] Appl. No.: 197,888

[22] Filed: Oct. 17, 1980

[51] Int. Cl.³ ............................................. G08B 29/00
[52] U.S. Cl. ..................................... 340/641; 340/513; 250/205
[58] Field of Search ............... 340/641, 642, 644, 654, 340/513, 510, 511; 324/414, 158 D; 315/134, 135; 250/205, 208, 209

[56] References Cited

U.S. PATENT DOCUMENTS

| | | |
|---|---|---|
| 3,198,236 | 8/1965 | Puech . |
| 3,208,060 | 9/1965 | Giuffrida et al. . |
| 3,346,855 | 10/1967 | Bishop . |
| 3,387,135 | 6/1968 | Engh ..................................... 340/513 |
| 3,555,410 | 1/1971 | Basu . |
| 3,562,534 | 2/1981 | Jarrett ................................. 250/205 |
| 3,575,607 | 4/1971 | Edstrom . |
| 3,588,891 | 6/1971 | Porter, Jr. ........................... 340/513 |
| 3,811,126 | 5/1974 | Winger ................................ 340/513 |
| 3,964,044 | 6/1976 | Busco . |
| 4,024,412 | 5/1977 | MacAskill, Jr. . |
| 4,092,587 | 5/1978 | Selkow, Jr. ......................... 324/28 R |
| 4,127,887 | 11/1978 | Tanaka et al. ........................ 361/86 |
| 4,222,047 | 9/1980 | Finnegan ............................. 340/641 |

Primary Examiner—Gerald L. Brigance
Attorney, Agent, or Firm—Alfred N. Feldman

[57] ABSTRACT

A fail safe type of monitoring circuit for contacts is provided using an opto-isolator. The opto-isolator is energized in response to the operation of the contacts to clearly indicate whether the contacts are open or closed, and whether the circuit components are functioning in a valid manner.

7 Claims, 2 Drawing Figures

DYNAMIC CONTACT CHECKING CIRCUIT

BACKGROUND OF THE INVENTION

The use of opto-isolators in electronic circuits has become quite common where electrical isolation between two circuit portions is desirable. Opto-isolators typically are made up of a light tight package including a light emitting diode and a light responsive transistor. The electrical separation is created by the transmission of information by the light from the light emitting diode to the light responsive transistor. In addition to providing electrical isolation, the opto-isolator has been used as extensively as an indicating or control device. This is true where the light emitting diode is energized in response to the energization of some other circuit portion so that the light responsive transistor can indicate or control further circuit elements. While the elements that make up an opto-isolator are normally quite reliable, there is always a possibility that the light emitting diode or the associated transistor could fail and the opto-isolator therefore become inoperative without that fact being known. In certain types of safety related equipment, such as flame safeguard equipment, the failure of an opto-isolator in a control or indicating circuit could be very serious. In recent years flame safeguard equipmemt utilizing microprocessors for control of the sequence of burner operations have been developed. Opto-isolators are used to convey information as to the status of relay contacts in the burner control system to the microprocessor. In this type of equipment the opto-isolators have been used for voltage isolation as well as for transmission of critical data. The failure of an opto-isolator in a critical circuit, such as a control circuit to a fuel valve, could cause an explosive situation at a burner or boiler.

SUMMARY OF THE INVENTION

The present invention is directed to the use of a simple indicator circuit means for energizing the light emitting diode of an opto-isolator so that the light emitting diode is driven in a dynamic fashion. The dynamic operation of the light emitting diode and its associated light responsive transistor provides a continuous output from the opto-isolator. The continuous output has two different states or characteristics so that the circuit to which the opto-isolator is responsive can be dynamically monitored. In the present invention, by way of example, if the opto-isolator is used to monitor the state of a pair of relay contacts, their state can be continuously verified. With the present circuit if the relay contacts are open, the output of the opto-isolator is a half wave rectified signal. When the relay contacts are closed, the opto-isolator is energized with full wave rectified current and the output thereby indicates the closed state of the contacts. In the event of a failure of the opto-isolator itself, the device would have no output and this would be recognized by the associated indicator or control circuitry.

DESCRIPTION OF THE PREFERRED EMBODIMENT

Figure 1:
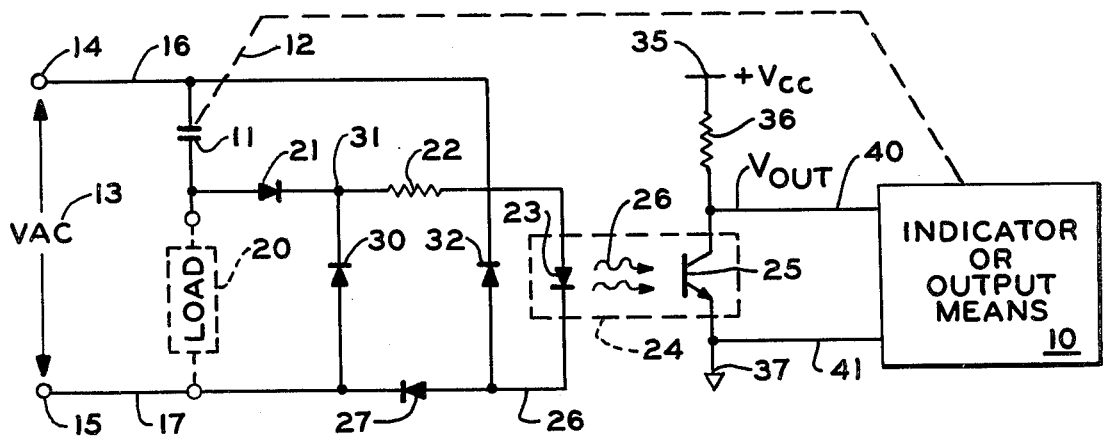
FIG. 1 is a simplified circuit application of an opto-isolator of the present invention.

The dynamic contact checking circuit means is disclosed in FIG. 1. The disclosure of FIG. 1 is a highly simplified circuit configuration in which an indicator or output means 10 is disclosed. The indicator or output means 10 could be simply an indicator to indicate the status of a pair of relay contacts 11 as shown at 12. The indicator or output means 10 more typically would be a control circuit including an internal relay to control the contacts 11 as indicated at 12. The indicator or output means 10 in fact is a microprocessor that is capable of both controlling the output relay and the contacts 11, while responding to the status by reading the state of the relay contacts 11. For simplicity sake, the present disclosure of FIG. 1 generally will be referred to as an output means 10. Its function will be described more fully in connection with the operation of contacts 11 if the system were considered as a microprocessor controlled flame safeguard circuit element.

The contacts 11 are provided to control an alternating current voltage disclosed at 13 which is connected to a pair of terminals 14 and 15. The terminal 14 is connected to a conductor 16 while the terminal 15 is connected to a conductor 17. Connected between the conductors 16 and 17 (through the relay contacts 11) is a load means 20. The load means 20 is a load which requires monitoring either for safety or merely for indication. The load 20 typically would be a fuel valve in a burner control system which is controlled and monitored by the output means 10 which would, as previously mentioned, be a microprocessor controlled device.

The contacts 11 and load 20 are connected in common by a diode 21 which in turn is connected through an impedance 22 which limits current through a light emitting diode 23 of an opto-isolator 24 that further includes a light responsive transistor 25. The opto-isolator 24 is a well known voltage or signal isolating circuit means where the light emitting diode 23 causes a switching action in the transistor 25 whenever a light 26 is present. The light emitting diode 23 is connected at a conductor 26 through a further diode 27 to the conductor 17 that is common to the load 20. The relay contacts 11, the diode 21, the impedance 22, the light emitting diode means 23, and the further diode 27 form a first indicator circuit means and it is quite apparent that when the contacts 11 are closed that current will be drawn through the light emitting diode means 23 to generate the light 26 to cause the transistor 25 to switch.

The dynamic contact checking circuit further includes a diode 30 that is connected from the conductor 17 to a point 31 that is common between the diodes 21 and the impedance 22. A diode 32 is connected from the conductor 26 to the conductor 16 and completes the input or indicating portion of the circuit. It will be noted that a circuit can be completed from the conductor 17 through the diode 30, the resistor or impedance 22, the light emitting diode 23, and the diode 32 to the line 16 thereby placing this further circuit or second indicator circuit means across the source of alternating current potential 13. The operations of the first indicator circuit means and the second indicator circuit means will be brought out after the device is disclosed in its entirety.

The transistor 25 is supplied with voltage 35 through a resistor 36 to ground 37 in a conventional fashion.

With this arrangement an output voltage $V_{out}$ is provided on a conductor 40 with respect to a ground conductor 41 that is connected to the ground 37. The output voltage between conductors 40 and 41 is a switched output that is responsive to the conductive and nonconductive states of the transistor 25 in response to the light 26 from the light emitting diode means 23.

Figure 2:
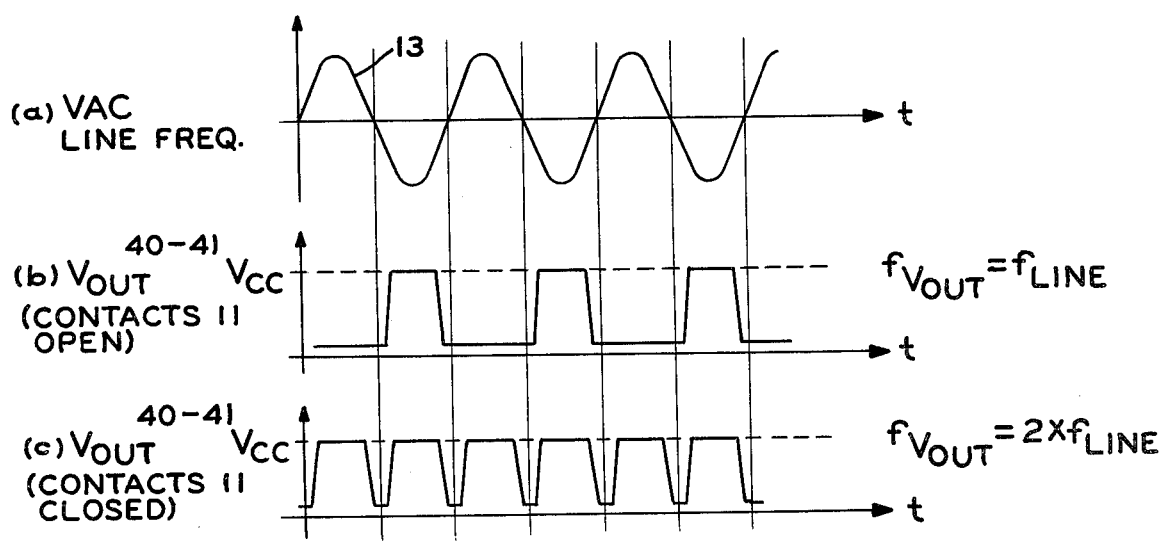
FIG. 2 is a representation of wave forms from the circuit of FIG. 1.

The operation of FIG. 1 will be described in connection with the wave forms disclosed in FIG. 2. In FIG. 2(a) the alternating current potential 13 is shown as a conventional alternating current potential which typically would be the 60 hertz frequency supplied in conventional equipment. The particular frequency involved is not material and the system can be used on any type of an alternating current voltage. In FIG. 2(b) a voltage output between the conductors 40 and 41 is disclosed when the relay contacts 11 are in an open condition. It will be noted that the frequency of the pulses generated when the contacts 11 are open is equal to the frequency of the alternating current potential 13. In FIG. 2(c) the voltage output between the conductors 40 and 41 is disclosed with the relay contacts 11 closed. It will be noted that the frequency of the output voltage has doubled and is now equal to two times the frequency of the alternating current potential 13. The way in which this is accomplished will now be described.

Considering FIG. 1, with the voltage 13 applied and the contacts 11 open, the output voltage between conductors 40 and 41 is shown in FIG. 2(b). This is accomplished by a current being drawn from the terminal 15 through the conductor 17 and the diode 30, the impedance 22, and the light emitting diode 23 where the current then returns via the diode 32 to the line 16 and the terminal 14. It is thus apparent that whenever the terminal 15 is positive potential with respect to the terminal 14, that a complete circuit has been established so that current can flow through the light emitting diode means 23 to cause the transistor 25 to change state. The reversal of polarities of the line voltage 13 so that the terminal 14 is positive with respect to terminal 15 provides no current flow through the light emitting diode 23. Each complete cycle therefore generates an output frequency between the conductors 40 and 41 that equals the line frequency.

If the output means 10 energizes its relay to close the contacts 11, the wave form disclosed in FIG. 2(c) occurs across the conductors 40 and 41. With the relay contacts 11 closed, a first indicator circuit means from the terminal 14 through the conductor 16 and the contacts 11 is established. Current will flow through the diode 21, the impedance 22, the light emitting diode means 23, and the diode 27 back to the terminal 15. When the polarity reverses on the terminals 14 and 15, the second indicator circuit means is active as was described in connection with the contacts 11 being open. This generates both halves of the output voltages shown in FIG. 2(c) thereby providing an output on conductors 40 and 41 that is twice the frequency of the line voltage 13. If the output means 10 is a microprocessor, it can easily read the frequencies to determine whether the contacts are open or closed.

The present invention precludes a failure from occurring in the light emitting diode 23 or in the transistor 25 that is not readily sensed by the output means 10 as the voltage across the conductors 40 and 41 would not provide the dynamic output frequencies that are inherent in the arrangement of the first indicator circuit and the second indicator circuit as disclosed in FIG. 1. With the arrangement just disclosed a very simple and reliable means of determining the state of the contacts 11 has been established and the output means 10 can respond safely in the event of any failure in the opto-isolator means 24. With the output means 10 having the capabilities of a microprocessor any equipment controlled thereby can respond almost immediately to a component failure or an inadvertent failure of the contacts 11. More particularly, the present arrangement is directed to sensing welded contacts 11 in which the output means 10 would call for the contacts 11 to open, but their failure to open would immediately be detected as an improper voltage configuration between the conductors 40 and 41. The output means 10 would then activate safety circuits to properly handle the situation of the welded contacts 11.

The present arrangement of FIG. 1 could be used in a much simpler security type of system. The contacts 11 could be manually operated contacts which would immediately provide an indicator signal at indicator means 10 to indicate whether or not the contacts were open or closed. If the system is used with a manual arrangement of opening and closing the contacts 11, the output means 10 merely would be an indicator without the previously mentioned microprocessor or relay for control functions. This is merely another application to which the present invention could be applied.

It is quite obvious that the present invention conveys a concept that is very simply implemented. Since the extension and implementation of this invention could be altered easily by one skilled in the art the applicant wishes to be limited in the scope of his invention solely by the scope of the appended claims.

The embodiments of the invention in which an exclusive property or right is claimed are defined as follows:

1. A dynamic contact checking means, including: opto-isolator means including light emitting diode means and light responsive transistor means which is capable of being electrically switched when said light emitting diode means conducts an electric current; bidirectional current conducing electric contact means adapted to controllably connect electric load means to a source of alternating current potential; first diode means connected in series with said light emitting diode means and said contact means to form first indicator circuit means; second diode means connected in series with said light emitting diode means to form second indicator circuit means; and said second indicator circuit means connected across said source of alternating current potential; said second circuit means conducting said current on every other half cycle of said alternating current potential, and said first circuit means conducting said current on the alternate half cycles of said alternating current potential when said contact means is closed.

2. A dynamic contact checking means as described in claim 1 wherein said light responsive transistor means is connected to output means including a relay; and said electric contact means is a pair of relay contacts controlled by said relay; said output means responding to said transistor means to insure safe operation of said pair of relay contacts.

3. A dynamic contact checking means as described in claim 1 wherein said light responsive transistor means is connected to indicator means with said indicator means indicating the status of said contact means.

4. A dynamic contact checking means as described in claim 2 wherein each of said diode means includes a pair of individual diodes connected in series with said light emitting diode means in said indicator circuit means.

5. A dynamic contact checking means as described in claim 3 wherein each of said diode means includes a pair of individual diodes connected in series with said light emitting diode means in said indicator circuit means.

6. A dynamic contact checking means as described in claim 4 wherein each of said indicator circuit means includes impedance means to limit a current flow in said light emitting diode means.

7. A dynamic contact checking means as described in claim 5 wherein each of said indicator circuit means includes impedance means to limit a current flow in said light emitting diode means.

* * * * *